United States Patent [19]

Kammann

[11] 4,187,554
[45] Feb. 5, 1980

[54] FAULT TOLERANT BUBBLE MEMORY WITH REDUNDANCY USING A STATIONARY REGISTER ON A SINGLE CHIP

[75] Inventor: Clarence H. Kammann, Minneapolis, Minn.

[73] Assignee: Control Data Corporation, Minneapolis, Minn.

[21] Appl. No.: 899,606

[22] Filed: Apr. 24, 1978

[51] Int. Cl.² .............................................. G11C 19/08
[52] U.S. Cl. ......................................... 365/15; 365/17
[58] Field of Search ............................. 365/12, 15, 17

[56] References Cited

U.S. PATENT DOCUMENTS 4,145,757 3/1979 Bonnie .................................. 365/15

OTHER PUBLICATIONS

IBM Technical Disclosure Bulletin—vol. 18, No. 9, Feb. 1976, pp. 3079-3081.

Primary Examiner—James W. Moffitt
Attorney, Agent, or Firm—William J. McGinnis, Jr.

[57] ABSTRACT

In a field access type bubble memory system using a major loop-minor loop organization, redundant loops are included in each memory chip so that defective minor loops may be disregarded and the memory retain its nominal capacity. Thus, the total number of loops is in excess of the nominal capacity. In one form of the invention the redundant loops are included with the minor loops. In another form of the invention, the redundant loops are independent of the minor loops. A stationary register or flaw chain having at least as many storage locations as the number of minor loops is located on the bubble memory chip with the major and minor loops. Each register location is assigned to contain information with respect to an assigned corresponding minor loop. An appropriate binary code identifies in the appropriate register location the corresponding minor loop which is defective, including nominally defective minor loops, if necessary, so that a number of loops equal to the nominal capacity of the memory are identified as good. Each time the memory is accessed, the contents of the register are accessed, nondestructively, and combined with the contents of the major loop so that only usable minor loops are accessed. Appropriate logic identifies which minor loops are to be accessed for both reading and writing. In one form of the invention, the contents of the stationary register are combined with the output of the major loop by means of a merge network on an alternating basis. In another form of the invention, the major loop is only associated with the nominal capacity number of minor loops and is disabled at the time a defective minor loop data position is to be accessed while at the same time an independent redundant minor loop is separately enabled.

5 Claims, 4 Drawing Figures

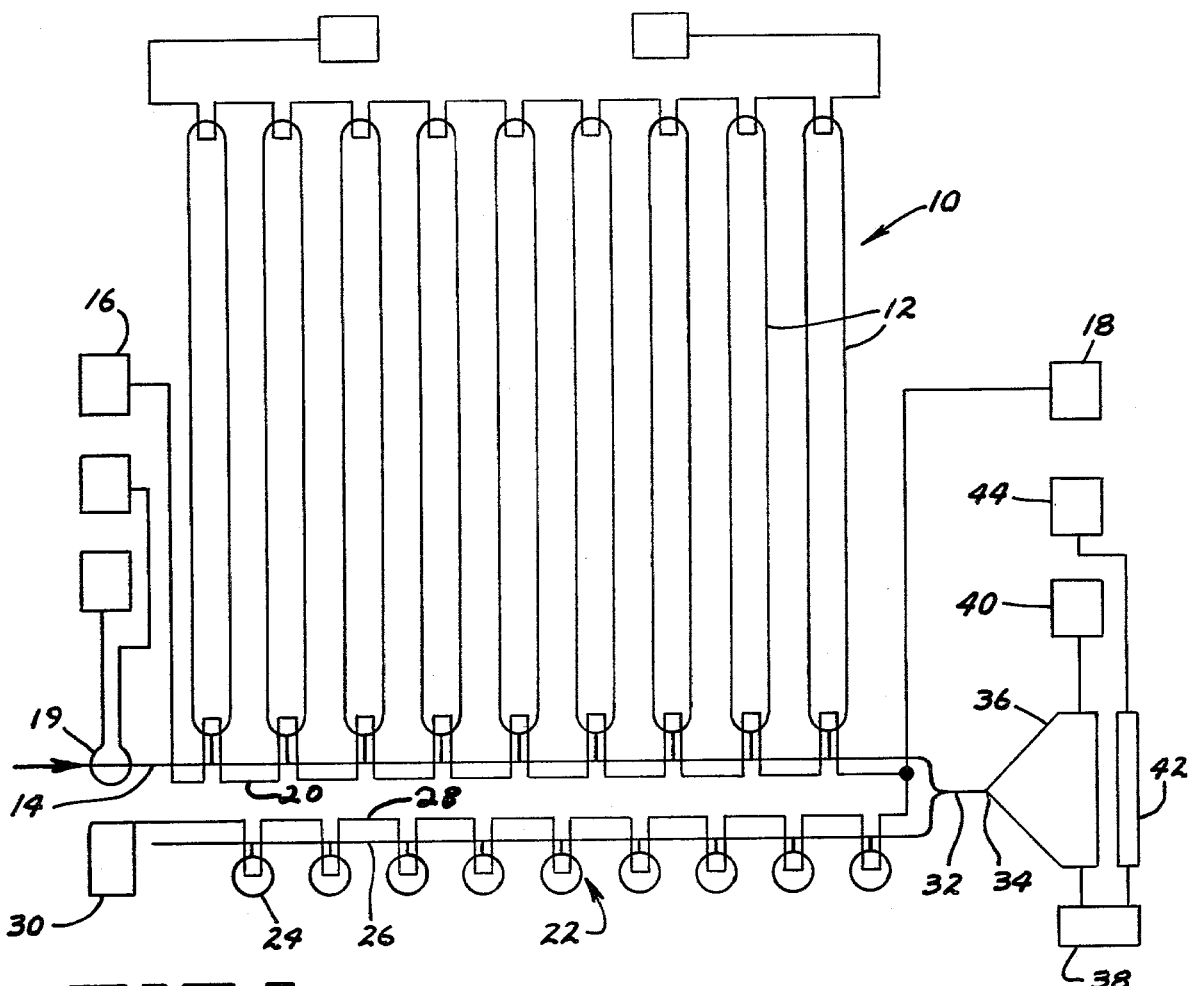
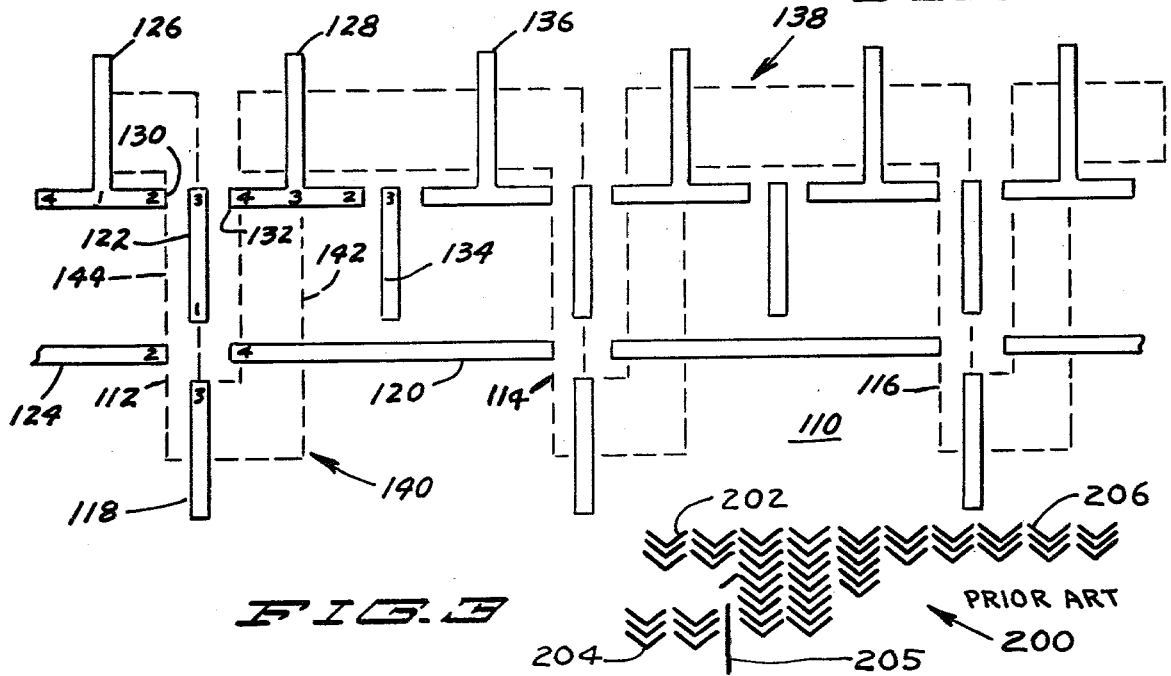

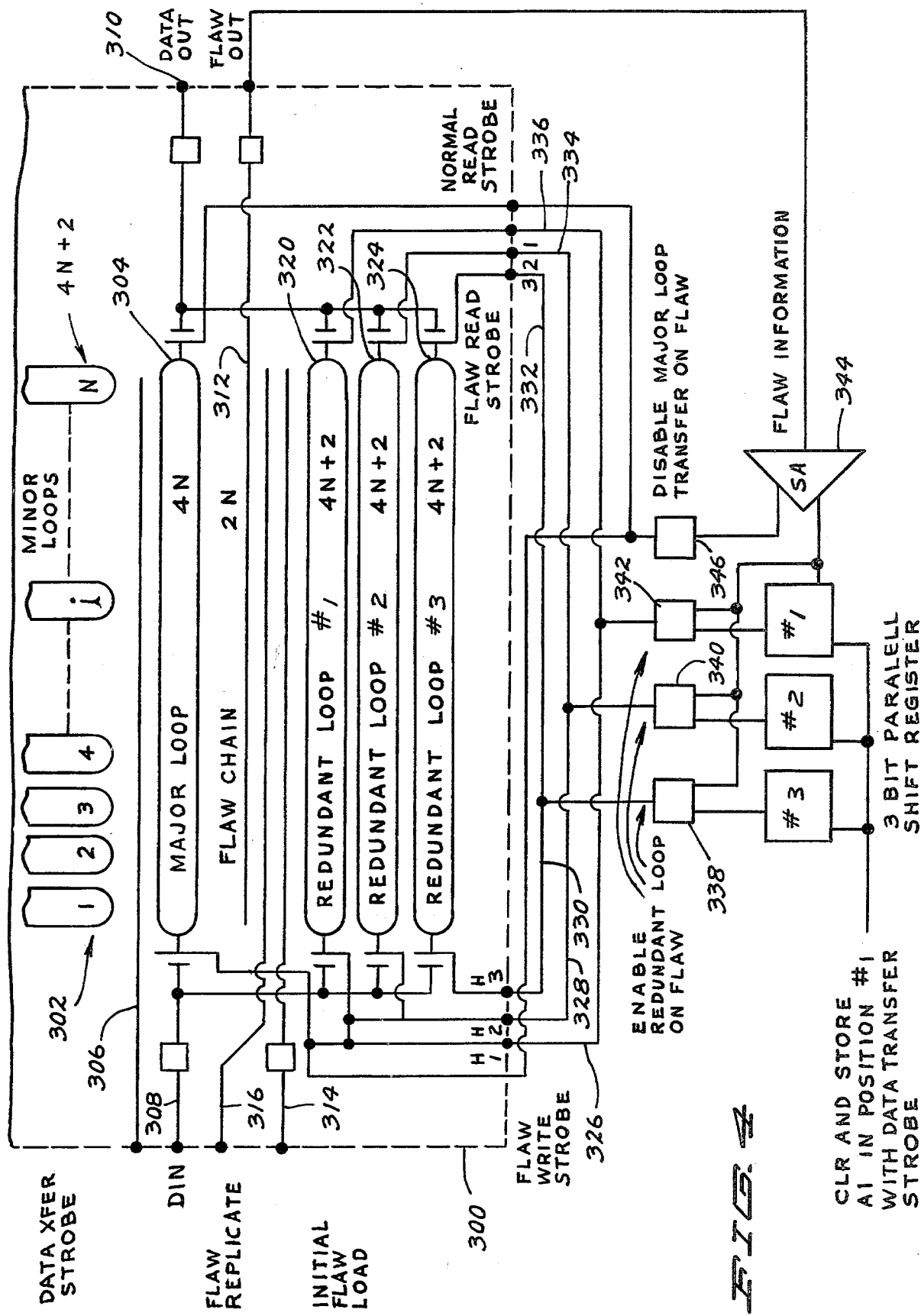

FAULT TOLERANT BUBBLE MEMORY WITH REDUNDANCY USING A STATIONARY REGISTER ON A SINGLE CHIP

RELATED APPLICATION DATA

This application is related to the following applications owned by the same assignee as this application: (1) NONCIRCULATING REGISTER FOR BUBBLE MEMORY SYSTEMS, Ser. No. 841,506, filed on Oct. 12, 1977; (2) FAULT TOLERANT SYSTEM FOR BUBBLE MEMORIES, Ser. No. 846,290, filed on Oct. 28, 1977 now U.S. Pat. No. 4,139,886; (3) FAULT TOLERANT BUBBLE MEMORY WITH REDUNDANCY USING A STATIONARY REGISTER ON A SINGLE CHIP, Ser. No. 841,505, filed on Oct. 12, 1977 now U.S. Pat. No. 4,145,757.

BACKGROUND OF THE INVENTION

This invention relates generally to fault tolerant bubble memory design. More particularly, this application is related to an invention for a bubble memory design having redundant loops in a major loop-minor loop field access design and a stationary register having at least the same number of positions as the total number of minor loops so that defective minor loops are internally identified in the memory. The redundant loops store data in place of defective minor loops and the flaw tolerant characteristics of the memory are transparent to the user.

In conventional manufacturing processes for bubble memory chips, a certain number of chips will prove to be defective and have to be discarded. Normal manufacturing control requires a certain trade-off between manufacturing 100% perfect devices and testing after the manufacturing process to discard or repair defective units. Obviously, defective memory chips cannot be repaired so the testing process must require that defective chips be discarded. Various designs in the prior art exist to increase the manufacturing process yield by designing bubble memory chips in such a way that a certain number of faults or defects may exist and yet have the chip usable in the particular bubble memory system. Many such fault tolerant designs exist employing both external logic and memory as well as various modifications of a standard chip design or combinations of both.

One system employing a modified chip design is shown in U.S. Pat. No. 3,921,156. In a normal major loop-minor loop field access memory design, the subject patent shows various bubble bypass circuits or loops in the system which may be semipermanently altered to eliminate defective minor loops. Such systems require comparatively complex bubble-bubble interactions on the memory chip in order to perform the path diversion logic functions and may be comparatively less reliable than certain externally performed logic functions.

Another concept involving alternation to magnetic paths from magnetic bubbles is shown in U.S. Pat. No. 3,990,058. However, the present application is based on major loop-minor loop organization rather than the alternation of paths in a serial memory. Furthermore, the present application does not involve alternation of magnetic bubble paths. U.S. Pat. No. 3,909,810 shows a scheme where extra minor loops are included in a bubble memory system and external memory sources are used together with logic devices to identify minor loops which are to be ignored in favor of the usable minor loops. Thus, all of the fault tolerance ability of the system shown in this patent is based on external logic devices while the memory chip differs from conventional memory chips only in that an excess number of minor loops are included on the chip in excess of the nominal capacity of the memory in order to allow for elimination of certain minor loops after testing. U.S. Pat. No. 4,073,012 shows a fault tolerant bubble memory which uses external logic and an external memory to contain faulty loop data.

U.S. Pat. No. 3,792,450 shows the use of a major loop-minor loop memory system having additional minor loops which are used for the purpose of containing a flaw table to identify the minor loop locations which are defective. This results in additional complexity to the memory in that additional connections and read gates are required to the memory chip to allow independent reading of the minor loop flaw tables. Further, care in design and construction of the system is required to insure that the proper synchronization is maintained between the minor loop and the remainder of the memory so that the correct correspondence is maintained in identity between indications of faulty minor loops and the actual faulty minor loops.

The present invention contains certain advantages in that synchronization of the flaw table is automatically constantly maintained with respect to faulty minor loop locations. A further advantage of the present invention is that no separate or external memory device needs to be programmed with the fault information since that is designed into each individual memory chip.

SUMMARY OF THE INVENTION

The present invention consists of a fault tolerant bubble memory chip based on the field access major loop-minor loop organization. A stationary or non-circulating register device is laid out on the chip to act as a flaw chain and contain information about defective minor loops. In one form of the invention it may be placed adjacent to and parallel to the major loop. The stationary register access locations are spaced from the corresponding locations for access to the minor loops and the non-circulating register contains a corresponding bit for each minor loop which contains the information in binary form as to whether the corresponding minor loop is usable or nonusable. The non-circulating register reads into a serial propagation track similar to the propagation track for the major loop. The contents of the major loop and the serial propagation path from the stationary register are are combined in a merge network which merges the two propagation paths on an every other one basis and reads into a conventional detector gate device on the bubble memory chip.

In another form of the invention, the contents of the minor loop locations and the stationary register are simultaneously accessed. The stationary register may be nondestructively read allowing the contents thereof to remain unchanged. The contents of the two propagation paths are combined in appropriate logic circuitry external to the bubble chip so that the flaw chain sinultaneously deactivates access to the major loop and activates access to one of several independent redundant loops. No data compressor is needed because data flows continuously and switching between the major loop and redundant loops is instantaneous.

In order to write into the bubble memory, the contents of the stationary register may be read into a register in external logic. Then, the external logic circuitry reads the data into the major loop in the conventional fashion, however, only valid minor loops are assigned data based on the contents of the storage register. Invalid or unusable minor loops may be assigned a value corresponding to the existence of no magnetic bubble. In operation, one of the primary benefits of the present invention is that no separate data compression or deskewing is needed and the bubble memory operates to the observer as if it were without flaws.

IN THE FIGURES

FIG. 1 is a schematic diagram of a bubble memory chip according to the present invention;

FIG. 2 is a detailed view of a segment of a stationary register suitable for use in the bubble memory chip shown in FIG. 1;

FIG. 3 is a detailed view of a merge network suitable for use in the bubble memory chip shown in FIG. 1; and FIG. 4 is a schematic diagram of another embodiment of a bubble memory chip according to the present invention.

DESCRIPTION OF THE PREFERRED EMBODIMENTS

Referring now to FIG. 1, a bubble memory chip 10 according to a first embodiment of the present invention is shown schematically. Conventional minor loops 12 are shown diagrammatically. A number of minor loops 12 are shown in excess of the nominal desired capacity of the memory. The number of extra minor loops is chosen to be a convenient number related to a reasonable allowance for defects. Thus, in a memory having a nominal word length of 256, corresponding to 256 usable minor loops, an additional 8 or even 16 minor loops may be added to the chip to allow for 8 or 16, respectively, defective minor loops. In order to illustrate the invention, however, only nine minor loops are shown corresponding to a desired memory capacity having an 8 bit word length with one redundant minor loop.

A major loop 14 of conventional design associated with the minor loops 12 is shown diagrammatically by a single line together with an arrow noting the direction of propagation. Pads 16 and 18 serve as external connections for a conductor loop 20 which serves to control access between the major loop 14 and the various minor loops. A bubble generator 19 is located at one end of major loop 14. All of this is known in the conventional art and need not be explained further.

A stationary register 22 is shown on the chip diagrammatically and as being placed adjacent to and parallel to the major loop 14. The stationary register 22 consists of a plurality of non-circulating or stationary bubble memory locations which may be accessed at will. The register 22 contains an identical number of locations corresponding to the number of minor loops on the chip with each minor loop having a corresponding register location. The register locations are offset with respect to the major loop so that although the data in the stationary register will be accessed simultaneously with access of the minor loop data into the major loop, the data is position adjusted somewhat.

An example of a stationary register suitable for use in this invention is shown and described in detail in a related patent application. Generally, a stationary register may consist of a plurality of bubble idlers 24, diagrammatically shown, connected with a propagation track 26. A conductor loop 28 controls access between the bubble idlers and the propagation path 26 in a manner analogous to that in which access between the minor loops and the major loop is controlled by conductor 20.

Pad 30 for external connection to the memory chip is provided to connect with one end of conductor 28 which shares its second termination with conductor 20 at pad 18. Propagation path 26 and the propagation path 14 associated with the major loop are combined by a merge network 32, shown in detail in FIG. 3. A single propagation path 34 exits from the merge network and extends to a conventional bubble detector 36 which is connected with electrical terminations 38 and 40. Electrical termination 38 is also shared in common with a bubble generate device 42 which has as its second termination pad 44.

Referring now to FIG. 2, which is more fully explained in a copending application, Ser. No. 841,506, a portion of a noncirculating or stationary register 110 suitable for use according to the present invention is shown. Three bubble idlers 112, 114 and 116 are shown to illustrate the repetitive pattern of a holding register of any desired length. Various types of bubble idlers may be used in various embodiments of the invention. Bubble idler 112 is comprised of four bars 118, 120, 122 and 124. Bar 120 also connects to idler 114 and bar 124 connects to the next idler to the left in the array which is not shown. A propagation track of the T-bar type is shown having generally identical elements and including elements 126 and 128 associated with idler 112. Other propagation tracks of different types may be used in other embodiments of the invention. Propagation tracks using semidisk elements or chevron elements may be used. For example, bar 122 which is part of idler 112 extends between the tips 130 and 132 of T-bars 126 and 128 respectively. A similar pattern repeats itself with respect to each of idlers 114 and 116 as well as other idlers not shown in this representation. Finally, between idlers 112 and 114 there is a single bar element 134 extending generally from the center of connecting bar element 120 upwardly between the tips of T-bar element 128 and 136.

A conductor 138 having a general path in line with the T-bar propagation track is shown by dashed lines. Associated with each of idlers 112, 114 and 116 is a conductor loop which may be used to control the system. Associated with idler 112 is a conductor loop 140 having a comparatively wide descending portion 142 and a comparatively narrow ascending portion 144. The loop is generally configured so that the edge of the loop passes in the vicinity of the tips of all of the bar elements proximate to which the bubble elements will travel. Note with respect to FIG. 2 that small numerals 1, 2, 3 and 4 are placed at the tips of the various elements associated with idler 112 and propagation track elements 126 and 128. These numbers correspond to the bubble locations when a counterclockwise rotating in-plane magnetic field is oriented in the particular direction. Obviously, when no bubble is present there will be no bubble location movement. With respect to idler 112, if a bubble is present in the idler, the bubble will pass through locations 1, 2, 3 and 4 at the tips of elements 122, 124, 118 and 120 in sequence as the rotating in-plane magnetic field rotates counterclockwise in sequence from the coordinate directions 1, 2, 3 and 4. Similarly, a bubble element present in the propagation track will follow locations 1, 2, 3 and 4 as shown with respect to bar element 122 and T-bar element 126.

Referring now to FIG. 3, a known prior art merge device 200 is shown for completeness of disclosure. Two propagation paths 202 and 204 leading from left to right in a position displaced relationship enter the device. The position displacement is related to bar 205 but is equivalent to one field rotation of bubble propagation. The combined, merged output appears on propagation track 206. Input 202 may be considered the input from major loop 14, while input 204 may be considered the input from path 26 of the stationary register. If the rotational bubble propagation field is reversed, then the merge network acts as a bubble replicator, with two identical output streams identical to the input.

The operation of the present invention will now be described, beginning with a newly prepared bubble memory chip. The newly manufactured chip is tested in a conventional way in a computer controlled tester. This involves attempts to store data in all locations and a tabulation of all the minor loops with zero or inadequate margin. After this initial test, the chip is packaged, cleared of all bubbles and the flaw table is loaded.

Loading the flaw table is accomplished by storing bubbles one at a time in the non-circulating register 22. A bubble is nucleated in the generator 19, propagated through the major loop 14, and into the merge element 32. Then, the field rotation direction is reversed and the bubble is propagated backward out of the merge element. The merge element functions as a passive replicator in the reverse direction and thus a bubble is now present on both the major loops 14 and propagation path 26. By keeping a count of field rotations, one may propagate the bubble in path 26 to the desired register location whereupon it can be replicated or transferred into an idler 24 with a current pulse. After this operation the field rotation direction is reversed once again and the remaining bubbles are propagated off the chip. This idler loading operation is then repeated as many times as necessary to fill the various idlers in the stationary register.

Since, typically the chip is in a packaged permanent magnet environment, the bubbles stored in the idlers will remain there perpetually unless intentionally removed.

A basic requirement for fault tolerant bubble chips is that bubbles not be stored in the defective minor loops. Bubbles entering such loops often wander into adjacent loops and thus double or triple the number of errors. For this reason it is necessary to insert false zeros at the bad bit points into the input data stream.

The writing operation begins by accessing the flaw table, register 22. A replicate current pulse is sent through the register's conductor pattern 28, thus stretching and dividing all of the bubbles present. A serial record of the idler contents now exists on the secondary major loop or propagation path 26.

The data is then propagated from register 22 through the merger element 32 to the detector 36 giving a serial data output. This output string is then used as the input to insert false zeros in the input data. The input data including false zeros now is produced by the generator 19 onto the primary major loop 14 for conventional insertion. All of this assumes suitable counting and timing such that the desired address is cleared and advanced to meet the data.

In reading data from a fault tolerant chip 10 it is necessary to remove the false zeros and compress the data into its original format. This is accomplished by using appropriate logic.

Using register 22 as a PROM, the operation is performed as follows. The minor loops are all propagated until the desired address presents itself to the major loop 14. At this point the conductors 20 and 28 in both the major loop 14 and path 26 are pulsed, transferring the output data and the flaw table to major loop 14 and propagation track 26. Note that the geometry of the chip and the closure of the minor loops causes bubbles to be placed only at every other location in each loop. Further, note that the two major loops are displaced one position with respect to one another, such that if the data is present on all the *even* locations of the primary loops, the flaw table appears on all the *odd* locations of the secondary loop. The two data streams are then propagated through the merge element where the respective data are combined into one string.

The detector output now consists of data, false zeros, and the interleaved flaw table. The flaw table contents can now be considered as "flag" bits which identify the preceding (or following) bits as true or false. By alternately strobing the output, the flag bits become the PROM input required to access only good data.

Referring now to FIG. 4, another embodiment of a bubble memory according to the present invention is shown formed on a bubble memory chip 300. In a manner similar to that of FIG. 1, FIG. 4 shows schematically a group of minor loops 302 arranged in a conventional fashion with a major loop 304. A conventional transfer electrode 306 is shown schematically. Data may be read into the major loop through electrode 308 and read out of the major loop through electrode 310. A flaw chain 312 is shown schematically and may consist of a stationary register such as shown in FIG. 2. Again, electrodes for providing an initial loading of the flaw chain are shown as 314 and an electrode 316 is shown to control reading of the flaw chain. As an example, three additional redundant minor loops 320, 322 and 324 are shown. Of course, the number of redundant loops is a matter of design choice and may be either more or less than three. These redundant loops have individual data strobe or control electrodes 326, 328 and 330 respectively. Similarly, strobe or control electrodes 332, 334 and 336 are provided respectively to control reading of information from the redundant loops. These electrodes are connected to enable circuits 338, 340 and 342 respectively. The flaw information from the flaw chain 312 is provided to a logic circuit 344 which in the presence of information from the flaw chain indicating a flaw causes a disable strobe 346 to disable the output from the major loop 304 and simultaneously activate an appropriate enable register from the group of enable registers 338, 340 or 342 to select one of the redundant loops 320, 322 or 324 to provide the correct bit of data output instead of the incorrect data output contained on major loop 304. Each time an enable register and its associated redundant loop is accessed, a shift register causes the next enable register and loop to be accessed for the next encountered faulty minor loop. The shift register selects the redundant loops to be used for storage or retrieval each time the memory is accessed. It begins a count at the beginning of an access cycle and is incremented for each flaw indicated in a minor loop.

What is claimed is:

1. A fault tolerant bubble memory device comprising, in a field access type bubble memory employing a major loop-minor loop configuration:

a stationary register having at least as many register positions as the total number of minor loops placed parallel to and adjacent to the major loop in a location to act as a flaw table, a logic element coupled with said major loop and said register so that the contents of said register and said major loop may be combined whereby defective minor loops may be disregarded and nominal memory capacity retained, said logic element receiving as its input the output of said register and having two outputs, at least one redundant loop not associated with said major loop, a first logic gate connected to one of said outputs from said logic element and having a connection with said major loop to disable access to said major loop in response to a flaw indication, and at least one enable gate associated with a said redundant loop and connected to the other output of said logic element to enable access to a redundant loop in the presence of a flaw indication.

2. The structure of claim 1 and including a plurality of redundant loops and a plurality of enable gates and further comprising further logic means to select which of said enable gates shall be controlled to operate at a particular flaw indication.

3. A fault tolerant bubble memory device comprising, in a field access type bubble memory employing a major loop-minor loop configuration:

at least one redundant loop not associated with said major loop, a stationary register having at least as many register positions as the total number of minor loops to act as a flaw table, and means for combining coupled with said major loop and said register so that the contents of said register and said major loop may be combined whereby defective minor loops may be disregarded and nominal memory capacity retained, wherein said means for combining comprises:

a logic device for receiving the output from said stationary register and generating an output in the presence of a flaw indication, a logic gate connected to said major loop for disabling access at the presence of a flaw indication from said logic device, and at least one enable gate connected to said redundant loop for enabling access at the presence of a flaw indication.

4. The structure of claim 3 wherein a plurality of redundant loops and a plurality of enable gates are provided and further comprising a shift register for activating only one enable gate at a time sequentially in the presence of flaw indications.

5. The structure of any of claims 3 or 4 wherein said stationary register is placed parallel to and adjacent to said major loop.

* * * * *